United States Patent
Fujii et al.

(10) Patent No.: US 7,955,933 B2
(45) Date of Patent: Jun. 7, 2011

(54) METHOD OF MANUFACTURING NONVOLATILE SEMICONDUCTOR MEMORY DEVICE

(75) Inventors: Narihisa Fujii, Tokyo (JP); Takashi Ono, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 1238 days.

(21) Appl. No.: 11/560,363

(22) Filed: Nov. 16, 2006

(65) Prior Publication Data

US 2007/0161188 A1    Jul. 12, 2007

(30) Foreign Application Priority Data

Dec. 22, 2005 (JP) .................... 2005-368994

(51) Int. Cl.
*H01L 21/336* (2006.01)

(52) U.S. Cl. ............. 438/287; 257/E21.18; 257/E21.21; 257/E21.423; 257/E21.679; 438/17; 438/216

(58) Field of Classification Search ............. 257/E21.18, 257/E21.21, E21.423, E21.679; 438/17, 438/216, 287

See application file for complete search history.

(56) References Cited

U.S. PATENT DOCUMENTS

| | | | | |
|---|---|---|---|---|
| 6,307,784 | B1 * | 10/2001 | Hamilton et al. | 365/185.22 |
| 6,344,994 | B1 * | 2/2002 | Hamilton et al. | 365/185.05 |
| 6,442,074 | B1 * | 8/2002 | Hamilton et al. | 365/185.29 |
| 6,456,533 | B1 * | 9/2002 | Hamilton et al. | 365/185.22 |
| 6,493,261 | B1 * | 12/2002 | Hamilton et al. | 365/185.11 |
| 6,590,811 | B1 * | 7/2003 | Hamilton et al. | 365/185.22 |
| 6,687,648 | B1 * | 2/2004 | Kumar et al. | 702/181 |
| 6,800,493 | B2 * | 10/2004 | Chou et al. | 438/4 |
| 2005/0036366 | A1 | 2/2005 | Ono | |

* cited by examiner

*Primary Examiner* — Anh Phung
*Assistant Examiner* — Michael Lulis
(74) *Attorney, Agent, or Firm* — Volentine & Whitt, P.L.L.C.

(57) ABSTRACT

A method of manufacturing a nonvolatile semiconductor memory device includes the steps of preparing a wafer having multiple memory cells, each memory cell having a gate electrode formed on a semiconductor substrate, charge storage units formed on both sides of the gate electrode, lightly doped regions formed beneath the charge storage units, respectively, in the upper part of the semiconductor substrate, and highly doped regions formed in a pair of regions sandwiching a region underneath the gate electrode and the lightly doped regions in between; erasing data stored in the charge storage units electrically; and treating the wafer at a high temperature for a predetermined period of time.

6 Claims, 10 Drawing Sheets

|  | GATE POTENTIAL Vg | SOURCE POTENTIAL Vs | DRAIN POTENTIAL Vd | BACK GATE POTENTIAL Vb |
|---|---|---|---|---|
| WRITING | 10[V] | 0[V] | 6[V] | 0[V] |
| READING OUT | 3.0[V] | 1.5[V] | 0[V] | 0[V] |
| ERASING (1) | −6[V] | 0[V] | 6[V] | 0[V] |
| ERASING (2) | −6[V] | open | 6[V] | 0[V] |
| ERASING (3) | −6[V] | 6[V] | 6[V] | 0[V] |

METHOD OF MANUFACTURING
METHOD OF MANUFACTURING NONVOLATILE SEMICONDUCTOR MEMORY DEVICE

BACKGROUND OF THE INVENTION

1. Field of the Invention

The present invention relates to a data erasing method which in particular is applied in a nonvolatile semiconductor memory device including a charge storage unit having an ONO (oxide-nitride-oxide) structure, and to a nonvolatile semiconductor memory device which in particular applies such data erasing method.

2. Background Information

One conventional type of nonvolatile semiconductor memory device would be a so-called single-cell two-bit nonvolatile semiconductor memory device in which each memory cell has two charge storage units and two resistance change layers (e.g., Japanese Laid Open Patent Application No. 2005-64295, hereinafter referred to as patent reference 1). In such nonvolatile semiconductor memory device, the charge storage units are arranged on both sides of the gate electrode, i.e., on a drain side and a source side, respectively, and the resistance change layers are arranged in semiconductor layers underneath the charge storage units, respectively.

Each charge storage unit has a structure in which a nitride film is sandwiched in between two oxide films. In the following, such structure will be referred to as an ONO (oxide-nitride-oxide) structure. In this structure, the nitride film functions as a charge storage film for storing entering electrical charges. The oxide films function as potential barrier films for trapping electrical charges inside the charge storage film.

In writing into the charge storage unit having the structure as described above, if a theoretical value '0' is to be written to the charge storage unit on the drain side, positive potential will be supplied to the drain, higher potential than that of the drain will be supplied to the gate, and the source will be at ground potential. Under these conditions, the electric field will be concentrated around a resistance change layer on the drain side where the impurity concentration is lower than that of the drain. Thereby, hot carriers will be generated in the resistance change layer on the drain side due to collisional ionization, and as the hot carriers enter the nitride film through the oxide film functioning as a potential barrier film, data will be written into the charge storage unit.

In addition, before shipping the nonvolatile semiconductor memory device as described above, an operation test will be done and then data meeting the needs of the shipping destination will be written therein. In this operation test, for instance, first, a reading test will be done under a state where no data has been written, and after that, a theoretical value '0' will be written into the charge storage unit in each memory cell, and then it will be confirmed whether the written data can be read out properly. After the confirmation, the data written for the test will be erased. Under a state where data has not been written, each charge storage unit keeps a theoretical value of '1'. Normally, this operation test will be conducted while the nonvolatile semiconductor memory devices are still in a wafer state, i.e., while the devices are not yet diced into individual pieces.

In erasing the data written for the test, normally, a high temperature neglect method will be applied. In this method, a wafer in which multiple nonvolatile semiconductor memory devices are formed will be left inside a high temperature container at a temperature of 300 to 400° C. for more than 100 hours, for instance. By this process, the data written in all the memory cells can be erased collectively.

However, with respect to such erasing method, the necessity of a long period of time of 100 hours or more will lead to a problem of decreasing manufacturing productivity and increasing manufacturing cost. In addition, with respect to this method, there is still a problem that the written data cannot be erased to a sufficient extent.

In order to resolve such problems, it is possible to use a method of erasing data electrically. In this erasing method, a bias potential will be applied in between the drain and the source for about a few milliseconds to one second, for instance. By this arrangement, hot carriers (e.g., hot holes) having opposite polarity to that of hot carriers (e.g., hot electrons) used at the time of data writing will be generated, and as these hot carriers enter the nitride film penetrating through the oxide film functioning as a potential barrier film, electrical charges having been kept in the nitride film will be neutralized, and as a result, the stored data will be erased.

However, in such electrical erasing method, a gate oxide film of a memory cell that is the object of erasure will be damaged electrically at the time of erasure. This will lead to deterioration in the disturb characteristic of the nonvolatile semiconductor memory device. Here, the disturb characteristic is defined as an influence that a certain memory cell will receive by writing actions with respect to other memory cells. Accordingly, a good disturb characteristic indicates that a certain memory cell will receive little influence by writing actions with respect to other memory cells.

With respect to the data erasing method, other than the two methods introduced above, there is a method using ultraviolet (UV) radiation. In this method, however, there are certain limits to the structures, such as the thickness of the nitride film that is the charge storage film, and the impurity concentration of the resistance change layer under the nitride film, which leads to a problem of deteriorating design flexibility.

In view of the above, it will be apparent to those skilled in the art from this disclosure that there exists a need for an improved data erasing method and an improved method of manufacturing a nonvolatile semiconductor memory device. This invention addresses this need in the art as well as other needs, which will become apparent to those skilled in the art from this disclosure.

SUMMARY OF THE INVENTION

It is therefore an object of the present invention to resolve the above-described problems and to provide a data erasing method and a method of manufacturing a nonvolatile semiconductor memory device which contribute to improving manufacturing productivity without having to deteriorate the disturb characteristic of the nonvolatile semiconductor memory device.

In accordance with one aspect of the present invention, a method of manufacturing a nonvolatile semiconductor memory device comprises the steps of: preparing a wafer having multiple memory cells, each memory cell having a gate electrode formed on a semiconductor substrate, charge storage units formed on both sides of the gate electrode, lightly doped regions formed beneath the charge storage units, respectively, in the upper part of the semiconductor substrate, and highly doped regions formed in a pair of regions sandwiching a region underneath the gate electrode and the lightly doped regions in between; erasing data stored in the charge storage units electrically; and treating the wafer at a high temperature for a predetermined period of time.

In accordance with another aspect of the present invention, a data erasing method comprises the steps of: preparing a wafer having multiple memory cells, each memory cell having a gate electrode formed on a semiconductor substrate, charge storage units formed on both sides of the gate electrode, lightly doped regions formed beneath the charge storage units, respectively, in the upper part of the semiconductor substrate, and highly doped regions formed in a pair of regions sandwiching a region underneath the gate electrode and the lightly doped regions in between; erasing data stored in the charge storage units electrically; and treating the wafer at a high temperature for a predetermined period of time.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

In the following, the structure shown in each drawing is shown with a certain shape, size and position in a way simple enough to show the outline of the present invention. Therefore, the present invention is not limited to the shape, size and position shown in the drawings. In addition, in each drawing, in order to clearly show the structure, a portion of the hatching in the cross-sectional surface thereof is omitted. Moreover, numerical values indicated in the following description are only given as examples, and therefore, they are not in the nature of limiting the present invention.

In this embodiment, a case will be described in which a nonvolatile semiconductor memory device has a MONOS structure where each memory cell has a single-cell two-bit system.

Structure

Figure 1:
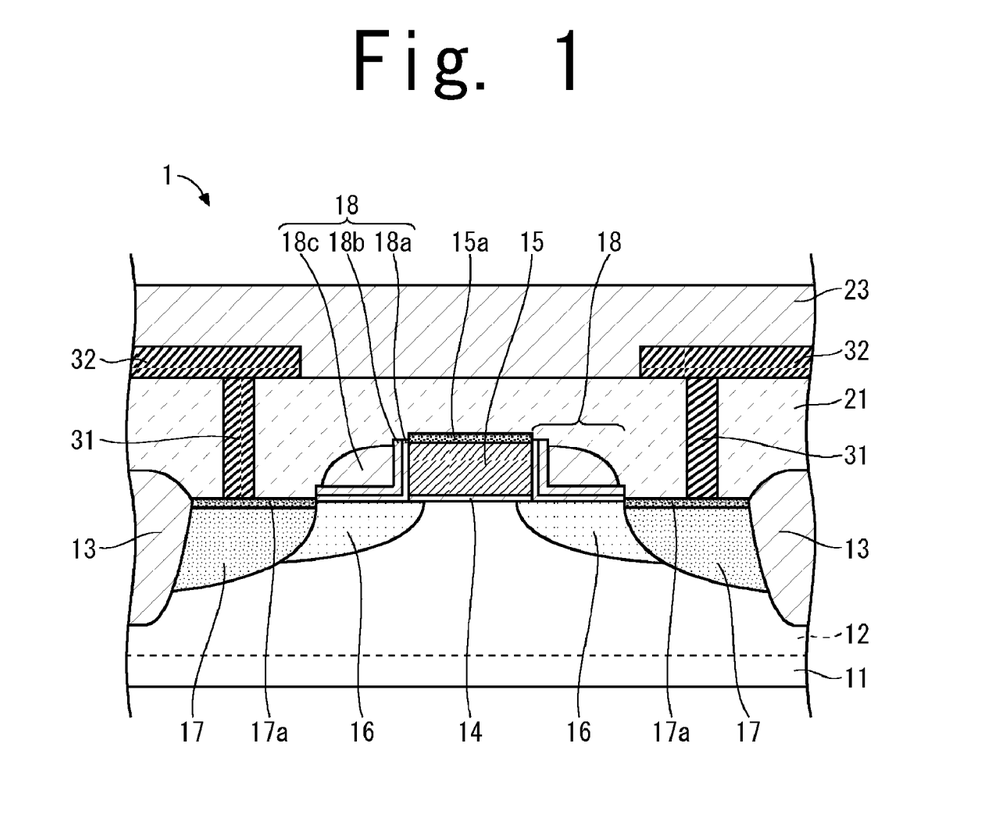
FIG. 1 is a diagram showing the overall configuration of a memory cell in the nonvolatile semiconductor memory device according to an embodiment of the present invention.

FIG. 1 is a diagram showing the overall configuration of a memory cell 1 in the nonvolatile semiconductor memory device according to the embodiment of the present invention. FIG. 1 shows a sectional structure of the memory cell 1 when cut along a surface perpendicular to a gate width direction.

As shown in FIG. 1, the memory cell 1 has a well region 12 formed in a semiconductor substrate 11, element separating insulation films 13, a pair of lightly doped regions 16, a pair of highly doped regions 17, a gate insulation film 14, a gate electrode 15, and charge storage units 18.

The semiconductor substrate 11 is a silicon substrate including p type impurities, for instance, and its substrate resistance is about 8 to 22 Ω (ohm). However, all types of other semiconductor substrates may be possible options for the semiconductor substrate 11 to be used in the present invention.

The well region 12 is a region for activating the upper part of the element forming surface of the semiconductor substrate 11, and it is formed by having impurities (e.g., boron ions) with p type conductivity, for instance, implanted into a certain region to a concentration of about $1\times10^{17}/cm^3$, for instance. However, this is not a limiting condition for the well region 12, since it is also possible to form the well region 12 by implanting impurities (e.g., phosphorus ions) with n type conductivity to a diffusion concentration of about $1\times10^{17}/cm^3$, for instance.

The element separating insulation films 13 function to define the active region as the element forming region on the surface of the semiconductor substrate 11. As for the element separating insulation film 13, it is possible to use a silicon oxide film formed by a LOCOS (local oxidation of silicon) method, for instance. However, this is not a limiting condition for the element separating insulation film 13, since it is also possible to use a silicon oxide film formed by an STI (shallow trench isolation) method, for instance, and all types of other insulation films may be possible options for the element separating insulation film 13.

The gate insulation film 14 is a silicon oxide film formed on the active region of the semiconductor substrate 11 to a thickness of about 100 Å (angstrom), for instance. The gate electrode 15 is a poly-silicon film formed on the gate insulation film 14. Here, the gate electrode 15 has electrical conductivity by including predetermined impurities. The thickness of the gate electrode 15 may be 3000 Å, for instance. The length of the gate electrode 15 in a gate longitudinal direction, i.e., the gate length of the gate electrode 15, may be about 0.15 μm, for instance. The upper part of the gate electrode 15 may be arranged to have low resistivity by having a silicide film 15a formed thereon, for instance.

The lightly doped regions 16 are a pair of regions on the upper part of the active region of the semiconductor substrate 11 and they sandwich the region beneath the gate electrode 15 therebetween. The lightly doped regions 16 may be formed by having impurities (e.g., phosphorous ions) with n type conductivity, for instance, implanted into certain regions to a diffusion concentration of about $1\times10^{17}/cm^3$, for instance. However, this is not a limiting condition for the lightly doped regions 16, since it is also possible to form the lightly doped regions 16 by implanting impurities (e.g., boron ions) with p type conductivity to a diffusion concentration of about $1\times10^{17}/cm^3$, for instance. Moreover, each lightly doped region 16 may extend to a portion underneath the gate electrode 15. Here, the portion where the gate electrode 15 overlaps the lightly doped region 16 may be called an overlap region.

The charge storage units 18 function to store data. They are formed on the lightly doped regions 16 on both sides of the gate electrode 15, respectively. Each charge storage unit 18 holds 1 bit of data. Here, each charge storage unit 18 has a structure in which two silicon oxide films 18a and 18c sandwich a silicon nitride film 18b therebetween, for instance. That is, the charge storage unit has an ONO structure. In this ONO structure, the silicon nitride film 18b functions as a charge storage film for holding data by trapping electrical charges, and the thickness of the silicon nitride film 18b may be about 100 Å, for instance. Among the two silicon oxide films sandwiching the silicon nitride film 18b therebetween, the silicon oxide film 18a on the lower side functions as a potential barrier film for preventing the electrical charges trapped in the silicon nitride film 18b from flowing out to the semiconductor substrate 11 and the gate electrode 15, and the thickness of the silicon oxide film 18a may be about 100 Å, for instance. On the other hand, among the two silicon oxide films sandwiching the silicon nitride film 18b therebetween, the silicon oxide film 18c on the upper side functions as a potential barrier film for preventing the electrical charges trapped in the silicon nitride film 18b from flowing out to the upper layer, and the thickness of the silicon oxide film 18c may be about 2700 Å, for instance. Here, the thicknesses of the silicon oxide films 18a and 18c do not necessarily have to be the thicknesses mentioned above, and may have other thicknesses so long as they are suitable to enable the electrical charges stored in the silicon nitride film 18b to be trapped. In addition, in this embodiment, the length of the charge storage unit 18 in a gate longitudinal direction (i.e., the width) may be about 500 Å, for instance. However, this is not a limiting condition for the charge storage unit 18, since the charge storage unit 18 may have another width.

When electrical charges are stored in the charge storage units 18 having the structure as mentioned above, the resistance value of the lightly doped regions 16 underneath the charge storage units 18 will change. The memory cell 1 having the MONOS structure uses this principle to read out data stored in the charge storage units 18. The lightly doped regions 16 underneath the charge storage units 18 are also called resistance change layers. In addition, in this embodiment, the charge storage units 18 function as sidewall spacers for electrically separating the highly doped regions 17 functioning as source and drain from the gate electrode 15.

The highly doped regions 17 are regions on the upper part of the active region of the semiconductor substrate 11 and they sandwich the region beneath where the gate electrode 15 and the charge storage units 18 are formed. As mentioned earlier, the highly doped regions 17 function as source and drain, respectively. The highly doped regions 17 may be formed by having impurities (e.g., phosphorous ions) with n type conductivity, for instance, implanted into certain regions to a diffusion concentration of about $1\times10^{20}/cm^3$, for instance. However, this is not a limiting condition for the highly doped regions 17, since it is also possible to form the highly doped regions 17 by implanting impurities (e.g., boron ions) with p type conductivity to a diffusion concentration of about $1\times10^{20}/cm^3$, for instance. Moreover, the upper parts of the highly doped regions 17 are arranged to have low resistivity by having silicide films 17a formed thereon.

On the memory cell 1 having the structure as described above, an intermediate insulation film 21 is formed, for instance. As for the intermediate insulation film 21, it possible to use a type of insulation film such as silicon oxide film, etc. The thickness of the intermediate insulation film 21 may be about 8000 Å when measured from the surface of the gate electrode (including the silicide film 15a), for instance. Here, the upper surface of the intermediate insulation film is planarized using a CMP (chemical and mechanical polishing) method or the like, for instance.

On the silicide films 17a above the highly doped regions 17 in the memory cell 1, contact holes are formed so as to penetrate through the intermediate insulation film 21, and by having these contact holes filled with certain conductive material such as tungsten (W), contact plugs 31 are formed. Upper layer wirings 32 are formed on the intermediate insulation film 21, and the upper layer wirings 32 are electrically connecting with the contact plugs 31. Thereby, the highly doped regions 17 (source/drain) in the memory cell 1 will be electrically drawn up on the intermediate insulation film (or interlayer insulation film) 21.

On the intermediate insulation film 21 where the contact plugs 31 and the upper layer wirings 32 are formed in the above-described way, a passivation 23 is formed. As for this passivation 23, it is possible to use a silicon nitride film, etc., with a thickness of about 5000 Å, for instance. Moreover, the upper surface of the passivation 23 may be planarized using a CMP method, etc., for instance.

Data Writing Method, Data Reading Method, and Data Erasing Method

Now, operations for writing data, reading data, and erasing data, respectively, with respect to the memory cell 1 having the above-described structure will be described. In this embodiment, the description to be given on data writing, data reading, and data erasing is related to each of multiple memory cells 1 in multiple nonvolatile semiconductor memory devices which have not yet been diced into individual pieces and which are aligned in two dimensions in a wafer.

Figure 2A:
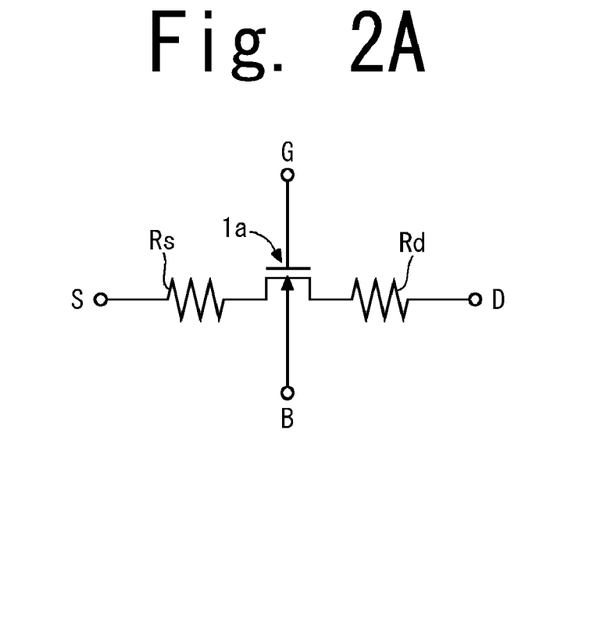
FIG. 2A is a diagram showing an equivalent circuit of the memory cell according to the embodiment of the present invention.

FIG. 2A is a diagram showing an equivalent circuit of the memory cell 1 according to this embodiment. As shown in FIG. 2A, the memory cell 1 has a MOSFET (metal oxide semiconductor field effect transistor) 1a which will be the core of the memory cell 1, a variable resistance Rd connected to a drain D side of the MOSFET 1a, and a variable resistance Rs connected to a source S side of the MOSFET 1a. The variable resistances Rd and Rs are resistances that are formed by the lightly doped regions 16 arranged underneath the charge storage units 18 shown in FIG. 1. Therefore, resistance values of the variable resistances Rd and Rs, respectively, will be controlled by the corresponding charge storage units 18 positioned on the lightly doped regions 16, respectively. In this equivalent circuit, a back gate B corresponds to the well region 12 shown in FIG. 1, and a gate G corresponds to the gate electrode 15 shown in FIG. 1. The nonvolatile semiconductor memory device in this embodiment includes multiple memory cells 1 having the equivalent circuit structure as described above. In addition, the wafer referred to in this description has multiple nonvolatile semiconductor memory devices, each of which includes multiple memory cells 1, arranged in two dimensions.

Data Writing Method

Now, the operation for writing data into the memory cell 1 according to this embodiment will be described. In this description, the initial state of the memory cell 1 before data is written is one in which data is not being written into the charge storage units 18, i.e., a state in which a theoretical value '1' is being stored in all charge storage units 18. In addition, in the following, a case in which a theoretical value '0' is to be written into the charge storage unit 18 on the drain D side of each memory cell 1 as data will be described.

In the case of writing a theoretical value '0' into the charge storage unit 18 on the drain D side, as shown by a row titled 'writing' in the table shown in FIG. 2B, the potential of the gate G (hereinafter referred to as gate potential Vg) shown in FIG. 2A is set to 10 volts (V), for instance, the potential of the source S (hereinafter referred to as source potential Vs) is set to ground potential (0V), for instance, the potential of the drain D (hereinafter referred to as drain potential Vd) is set to 6V, for instance, and the potential of the back gate B (hereinafter referred to as back gate potential Vb) is set to ground potential (0V), for instance.

Under these conditions, on the drain D side, the electric field will concentrate around the lightly doped region 16 where the impurity concentration (i.e., concentration of impurities with n type conductivity, in this case) is lower than that of the highly doped region 17. Thereby, hot carriers (i.e., hot electrons in this case) will be generated intensively in the lightly doped region 16 on the drain D side due to collisional ionization.

The hot electrons generated in such way will penetrate through the silicon oxide film 18a that is a potential barrier film in the charge storage unit 18 on the drain D side, and enter into the silicon nitride film 18b that is a charge storage film. The carriers (i.e., electrons in this case) entering the silicon nitride film 18b will be trapped in the silicon nitride film 18b by the silicon oxide films 18a and 18c that are the potential barrier films. Thereby, a theoretical value '0' will be written into the charge storage unit 18 on the drain D side.

The voltage (i.e., drain voltage Vd) to be applied to the drain D at the time of writing the theoretical value '0' into the charge storage unit 18 on the drain D side does not necessarily have to be the value as mentioned above. The drain voltage Vd may be any value as long as it is suitable to enable hot electrons to be generated in the lightly doped region 16 on the drain D side. For instance, the drain voltage Vd may be about 2V or greater, or more preferably, it may be about 5 to 10V. In addition, the voltage (i.e., gate voltage Vg) to be applied to the gate G at this time does not necessarily have to be the value as mentioned above. The gate voltage Vg may be any value as long as it is suitable to enable enough carriers to be generated in the region where the channel is supposed to be formed (i.e., in the upper part of the well region 12, also referred to as the channel forming region) and as long as it is suitable to enable the hot electrons generated on the drain D side to enter into the silicon nitride film 18b (i.e., the charge storage film) in the charge storage unit 18.

Data Reading Method

Now, the operation for reading out data from the memory cell 1 according to this embodiment will be described. In this description, a case in which data is to be read out from the memory cell 1 in which the theoretical value '0' is written into the charge storage unit 18 on the drain D side according to the above-described data writing method will be described.

Figure 2B:
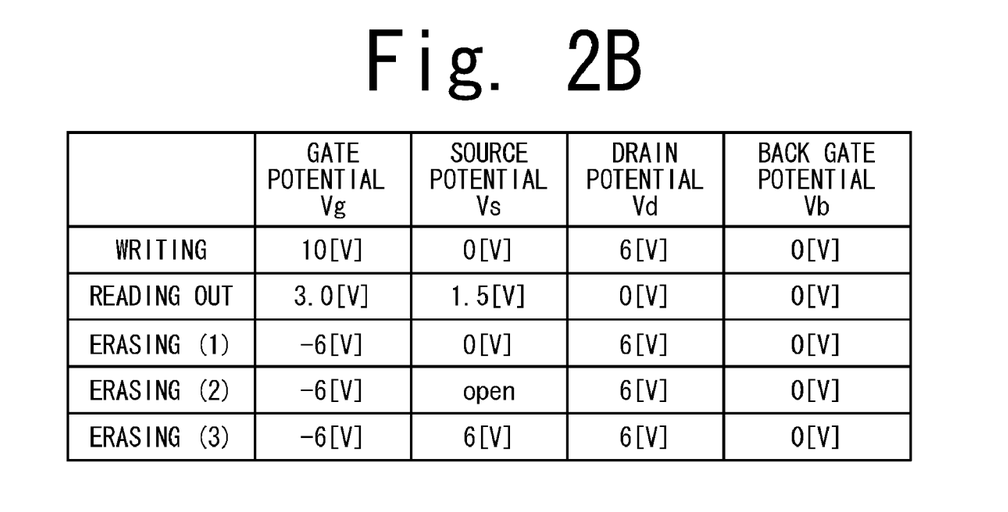
FIG. 2B is a table showing the potential of the gate, source, drain, and back gate, in each of the methods of writing data, reading data, and erasing data in the memory cell according to the embodiment of the present invention.

When data is to be read out from the charge storage unit 18 on the drain D side, as shown by the row titled 'reading out' in the table shown in FIG. 2B, the gate potential Vg shown in FIG. 2A is set to 3.0V, for instance, the source potential Vs is set to 1.5V, for instance, the drain potential Vd is set to ground potential (0V), for instance, and the back gate potential Vb is set to ground potential (0V), for instance.

Here, as described earlier, when electrical charges are being stored in the charge storage unit 18 on the drain D side, the resistance value of the lightly doped region 16 underneath this charge storage unit 18 will change. In this particular case, since the theoretical value '0' is written, the resistance value of the lightly doped region 16 (i.e., the resistance Rd) will increase. As a result, a channel will not be formed easily in the channel forming region at the time of reading out data, and the amount of current flowing into the channel forming region will decrease.

On the other hand, in the case when the theoretical value '1' is being stored in the charge storage unit 18 (e.g., in the initial state for example), the resistance value of the lightly doped region 16 underneath this charge storage unit 18 will become lower than that when the theoretical value '0' is being stored in the charge storage unit 18. Therefore, compared to when the theoretical value '0' is stored in the charge storage unit 18, when the theoretical value '1' is stored in the charge storage unit 18, a channel will be formed more easily in the channel forming region at the time that data is read out. This means that a comparatively large amount of current will flow into the drain D side. In this embodiment, the difference in the amount of current, i.e., the difference between the amount of current flowing into the drain D side when the theoretical value '1' is being stored in the charge storage unit 18 and the amount of current flowing into the drain D side when the theoretical value '0' is being stored in the charge storage unit 18, will be used to read out data from each memory cell 1.

Data Erasing Method

Now, the operation for erasing data in the entire memory cells 1 of the nonvolatile semiconductor memory device according to this embodiment will be described.

In this embodiment, in erasing data in all memory cells 1 of the nonvolatile semiconductor memory device, electrical erasing and erasing by high temperature neglect (hereinafter referred to as bake erasing) will be conducted both in order to erase data effectively and sufficiently without deteriorating the disturb characteristic of the nonvolatile semiconductor memory device.

Electrical Erasing (First Stage)

In this embodiment, in erasing data in the entire memory cells 1 of the nonvolatile semiconductor memory device, first, electrical erasing will be conducted. In the following, electrical erasing conducted in the case when the theoretical value '0' is being stored in the charge storage unit 18 on the drain D side of the memory cell 1 (i.e., when erasing data stored in the drain D side), and electrical erasing conducted in the case when the theoretical value '0' is being stored in the charge storage unit 18 on both the drain D side and the source S side (i.e., when erasing data stored in both the drain D side and the source S side), will be described respectively.

Erasing Data Stored in Drain D Side

First, in the case of erasing the theoretical value '0' stored in the charge storage unit 18 on the drain D side, as shown by the row titled 'erasing (1)' or 'erasing (2)' in the table of FIG. 2B, for instance, the gate potential Vg shown in FIG. 2A is set to −6V, for instance, the source potential Vs is set to ground potential (0V) or indeterminate state (also called open state), for instance, the drain potential Vd is set to 6V, for instance, and the back gate potential Vb is set to ground potential (0V), for instance.

Under these conditions, if a bias potential is applied between the drain D and the gate G for approximately a few milliseconds to one second, during this period, the electrical field in an opposite direction to that at the time of writing data will be concentrated around the lightly doped region 16 on the drain D side, the lightly doped region 16 having a lower impurity concentration than that of the highly doped region 17. Thereby, hot carriers (i.e., hot holes in this case) with an opposite polarity to that of the hot carriers when writing data will be generated intensively in the lightly doped region 16 on the drain D side due to collisional ionization.

The hot electrons generated in such way will penetrate through the silicon oxide film 18a that a potential barrier film in the charge storage unit 18 on the drain D side and enter into the silicon nitride film 18b that a charge storage film. When the holes enter the silicon nitride film 18b in this way, the electrons kept in the silicon nitride film 18b will be electrically neutralized. Thereby, the theoretical value '0' stored in the charge storage unit 18 on the drain D side will be erased.

Erasing Data Stored in Both Drain D side and Source S Side

In the case of erasing the theoretical value '0' stored in the charge storage unit 18 on both the drain D side and the source S side, as shown by the row titled 'erasing (3)' in the chart of FIG. 2B, for instance, the gate potential Vg shown in FIG. 2A is set to about −6V, for instance, the source potential Vs is set to 6V, for instance, the drain potential Vd is set to 6V, for instance, and the back gate potential Vb is set to ground potential (0V), for instance.

Under these conditions, if a bias potential is applied between the drain D and the gate G and between the source S and the gate G, respectively, for approximately a few milliseconds to one second, during this period, the electrical field in the opposite direction to that when writing data will be concentrated around the lightly doped region 16 on both the drain D side and the source S side, the lightly doped region 16 having a lower impurity concentration than that of the highly doped region 17. Thereby, hot carriers (i.e., hot holes in this case) with an opposite polarity to that of the hot carriers when writing data will be generated intensively in the lightly doped region 16 on both the drain D side and the source S side due to collisional ionization.

The hot electrons generated in such way will penetrate through the silicon oxide films 18a that are potential barrier films in the charge storage units 18 on the drain D side and the source S side, respectively, and enter into the silicon nitride films 18b that are charge storage films in the charge storage units 18, respectively. When the holes enter the silicon nitride films 18b in this way, the electrons having been kept in the silicon nitride films 18b will be electrically neutralized. Thereby, the theoretical values '0' stored in the charge storage units 18 on the drain D side and the source S side, respectively, will be erased.

The voltage (i.e., drain voltage Vd) to be applied to the drain at the time of erasing data stored in the charge storage units 18 does not necessarily have to be the value mentioned above. The drain voltage Vd may be any value so as long as it is suitable to enable hot holes to be generated in the lightly doped regions 16. For instance, the drain voltage Vd may be about 2V or greater, or more preferably, it may be about 4 to 10V. In addition, the voltage (i.e., gate voltage Vg) to be applied to the gate G at this time is a voltage for effectively gathering up the generated hot holes around each silicon oxide film 18a, and it does not necessarily have to be the value mentioned above. For instance, the gate voltage Vg may be about −10 to 0V.

Bake Erasing (Second Stage)

In this embodiment, after having data erased from the entire memory cells 1 in the nonvolatile semiconductor memory device using the above-described electrical erasing process, a bake erasing process is to be conducted. In this bake erasing process, a wafer in which multiple nonvolatile semiconductor memory devices according to this embodiment are formed will be left inside a high temperature container at a temperature of 350° C. for 2 hours, for instance. In the following, the container temperature will be referred to as baking temperature, and the amount of time that the wafer is left in the high temperature container will be referred to as baking time.

Characteristic Comparison

Figure 3:
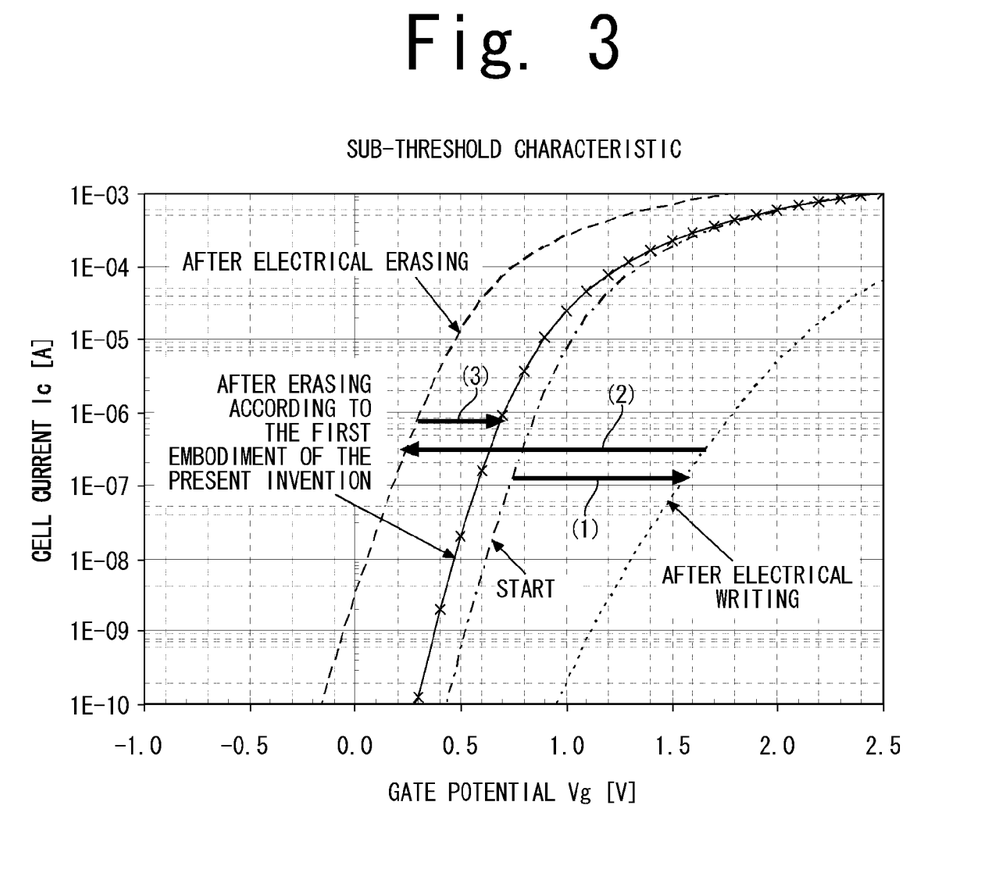
FIG. 3 is a graph showing a sub-threshold characteristic of the memory cell according to the embodiment of the present invention.

Here, a comparison between the case of using the electrical erasing process alone and the case of using the erasing processes according to the embodiment of the present invention will be shown. FIG. 3 shows a sub-threshold characteristic of a memory cell 1 having only an electrical erasing process (2) conducted after an electrical writing process (hereinafter referred to simply as the writing process) (1), and a sub-threshold characteristic of a memory cell 1 having the erasing processes (2, 3) according to this embodiment, i.e., electrical erasing process (2) and bake erasing process (3), conducted after the writing process (1). In addition, as reference, a sub-threshold characteristic of a memory cell 1 in the initial state, i.e., a memory cell 1 not having any writing process (1), electrical erasing process (2) or bake erasing process (3) conducted thereon, and a sub-threshold characteristic of a memory cell 1 having only a writing process (1) conducted thereon are shown in FIG. 3. In this description, a threshold characteristic may be represented by the relationship between a gate potential Vg at the time of reading and a cell current Ic read out from the memory cell 1. Here, a cell current Ic indicates the current flowing in between the drain D and the source S of the memory cell 1 at the time of writing.

In this description, in the writing process (1), the gate potential Vg is set to 10V, the source potential Vs is set to ground potential (0V), the drain potential Vd is set to 6V, the back gate potential Vb is set to ground potential (0V) (q.v., the row titled 'writing' in the table of FIG. 2B), and writing time is set to 20 µs (micro seconds). Thereby, a theoretical value '0' will be written only into the charge storage unit 18 on the drain D side. In the electrical erasing process (2), the gate potential Vg is set to −6V, the source potential Vs is set to ground potential (0V), the drain potential Vd is set to 6V, the back gate potential Vb is set to ground potential (0V) (q.v., the row titled 'erasing (1)' in the table in FIG. 2B), and erasing time is set to 20 ms (milliseconds). Thereby, the theoretical value '0' stored in the charge storage unit 18 on the drain D side will be erased. Moreover, in the bake erasing process (3), baking temperature is set to 350° C. and baking time is be set to 2 hours.

Figure 4:
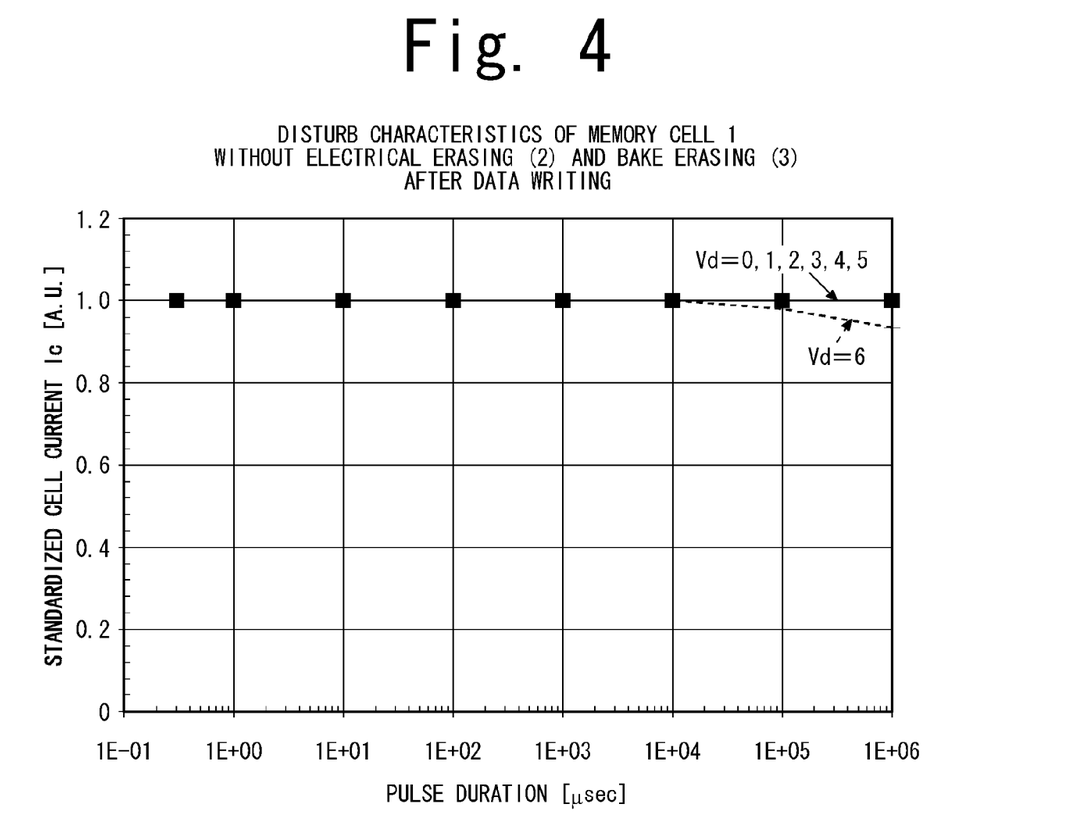
FIG. 4 is a graph showing the disturb characteristic of a memory cell according to the embodiment of the present invention, which has not gone through either an electrical erasing process (2) or a bake erasing process (3), after data is written on its drain D side.
Figure 5:
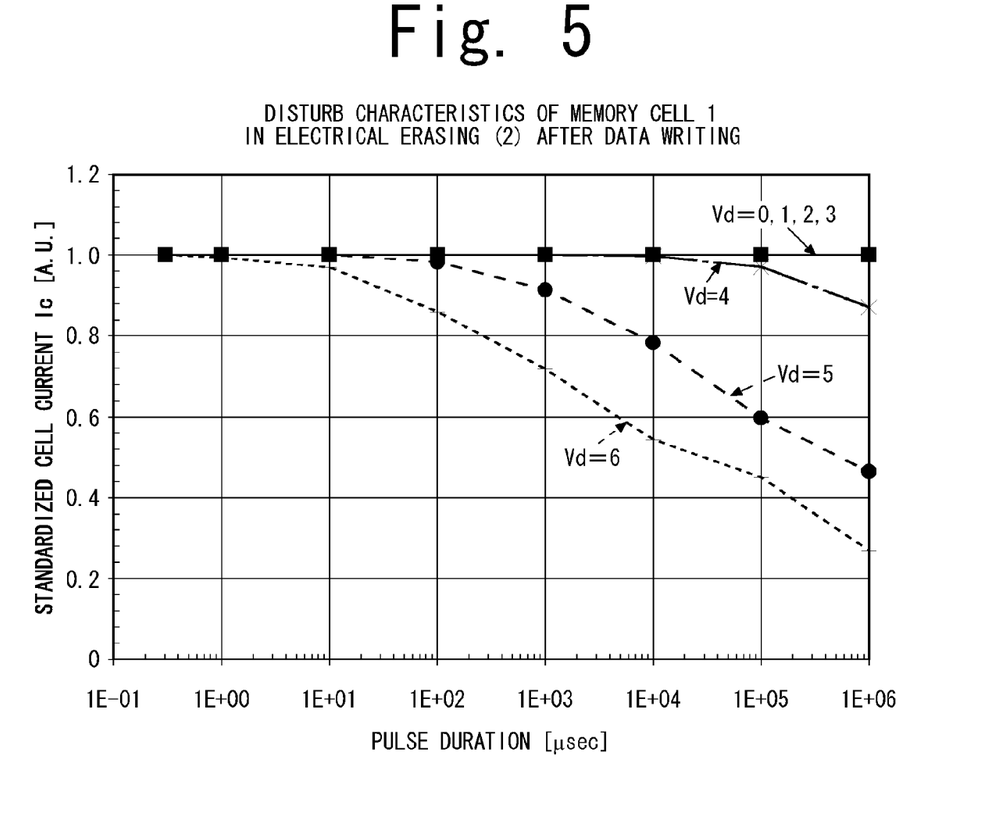
FIG. 5 is a graph showing the disturb characteristic of a memory cell according to the embodiment of the present invention, which has gone through only an electrical erasing process (2), after data is written on its drain D side.
Figure 6:
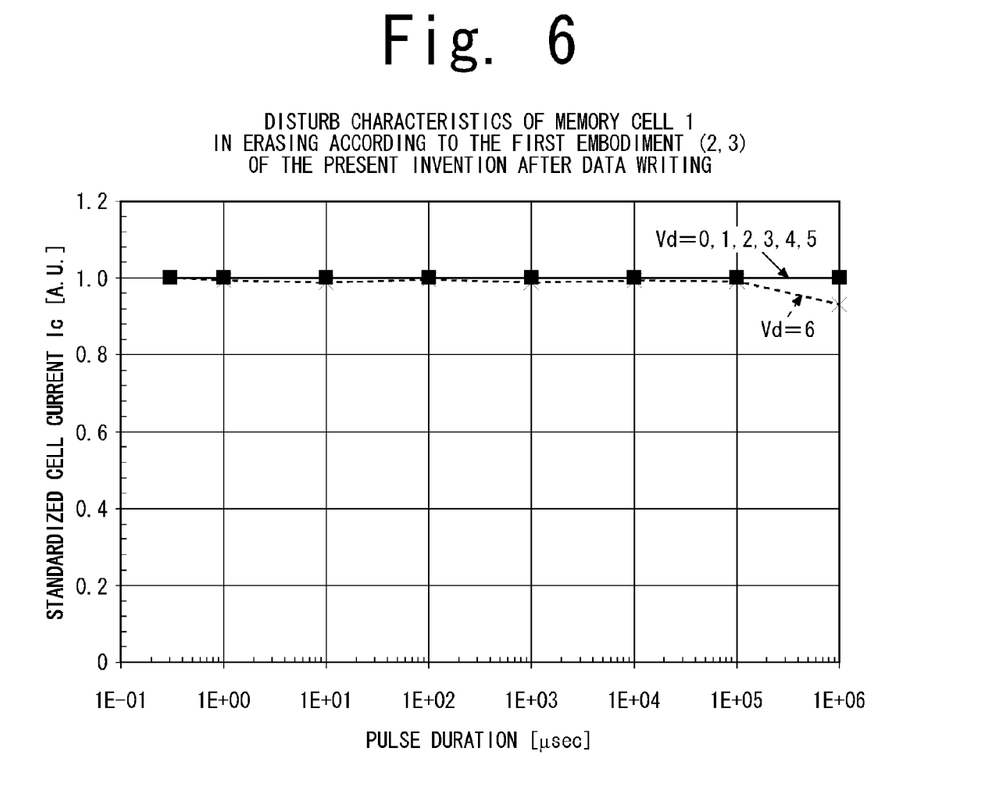
FIG. 6 is a graph showing the disturb characteristic of a memory cell according to the embodiment of the present invention, which has gone through the erasing processes (2, 3), after data is written on its drain D side.

A disturb characteristic of a memory cell 1, which has not gone through either an electrical erasing process (2) or a bake erasing process (3), i.e., a memory cell 1 in the initial state, after data is written on its drain D side is shown in FIG. 4. A disturb characteristic of a memory cell 1, which has gone through only an electrical erasing process (2), after data is written on its drain D side is shown in FIG. 5. A disturb characteristic of a memory cell 1, which has gone through the erasing processes (2, 3) according to this embodiment, after data is written on its drain D side is shown in FIG. 6. In this description, a disturb characteristic may be represented by the relationship between a writing pulse time width (hereinafter referred to as pulse duration) at the time of data writing and the cell current Ic read out from the memory cell 1. Moreover, FIG. 4 to FIG. 6 show disturb characteristics where the standardized cell current Ic is represented in a vertical axis and the drain potential Vd used at the time of data writing takes different values as 0, 1, 2, 3, 4 and 5.

As shown in FIG. 3, comparing the sub-threshold characteristic of the memory cell 1 having gone through only the electrical erasing process (2) after the writing process (1) and the sub-threshold characteristic of the memory cell 1 having gone through the erasing processes (2, 3) according to this embodiment after the writing process (1), the sub-threshold characteristic in the case using the erasing processes (2, 3) according to this embodiment is closer to the sub-threshold characteristic of the memory cell 1 in the initial state. That is, in the case of using the erasing processes (2, 3) according to this embodiment, the sub-threshold characteristic can be improved.

Accordingly, as shown in FIG. 4 to FIG. 6, as compared to the disturb characteristic of the memory cell 1 having gone through only the electrical erasing process (2) after the writing process (1) (q.v., FIG. 5), the disturb characteristic of the memory cell 1 having gone through the erasing processes (2, 3) according to this embodiment after the writing process (1) (q.v., FIG. 6) is closer to the disturb characteristic of the memory cell 1 which has not gone through either the electrical erasing process (2) or the bake erasing process (3) (q.v., FIG. 4). In other words, by using the erasing processes (2, 3) according to this embodiment, it is possible to improve the disturb characteristic of the memory cell 1 to approximately the level of the disturb characteristic of the memory cell 1 in the initial state when the memory cell 1 has not received any damage by having data written thereto. Such tendency will become more prominent especially when the pulse duration at the time of data writing is made longer or when the drain potential Vd at the time of data writing is made greater.

In this way, in the embodiment of the present invention, the bake erasing process (3) is conducted after the electrical erasing process (2) is conducted, and thereby, it is possible to improve the disturb characteristic of the nonvolatile semiconductor memory device to approximately the level of the disturb characteristic in the initial state. Moreover, in this embodiment, since the electrical erasing process (2) is conducted before the bake erasing process (3), it is possible to easily lower the baking temperature or shorten the baking time as compared to the case where only the bake erasing process (3) is to be conducted. Therefore, as compared to the case where only the bake erasing process (3) is to be conducted, this embodiment is capable of achieving improved manufacturing productivity.

Conditions of Bake Erasing

The conditions of the bake erasing process (3) in this embodiment are not limited to the ones mentioned above. In the following, preferable conditions of the bake erasing process (3) will be described.

Figure 7:
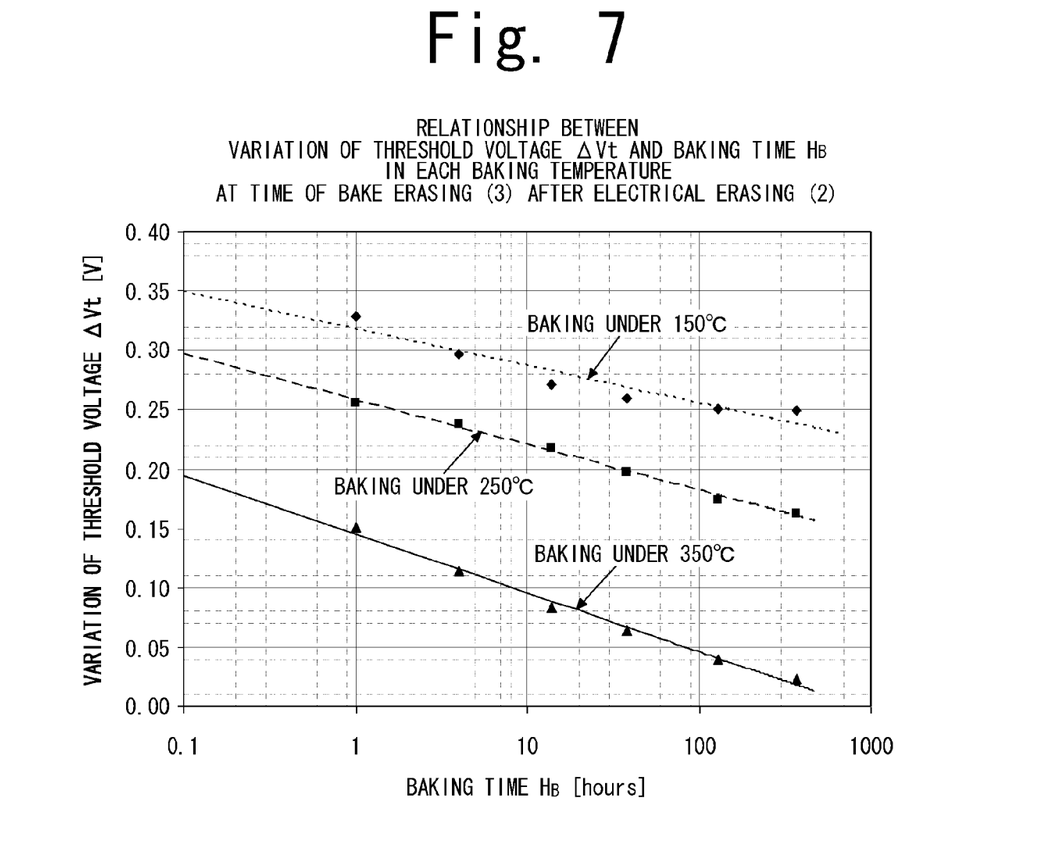
FIG. 7 is a graph showing the relationship between baking time $H_B$ and threshold voltage variation $\Delta Vt$ according to the embodiment of the present invention.

FIG. 7 is a graph showing a relationship between baking time $H_B$ and threshold voltage variation $\Delta Vt$ at the time of bake erasing (3) after electrical erasing (2), at different baking temperatures $T_B$ as 150° C., 250° C., and 350° C., respectively. Here, the threshold voltage variation $\Delta Vt$ is an absolute value of a difference between a threshold voltage Vt that the memory cell 1 having gone through the erasing process at each condition has and a threshold voltage Vt that the memory cell 1 in the initial state has. Moreover, in the writing process (1) in this description, the gate potential Vg is set to 10V, the source potential Vs is set to ground potential (0V), the drain potential Vd is set to 6V, the back gate potential Vb is set to ground potential (0V) (q.v., the row titled 'writing' in the table in FIG. 2B), and erasing time is set to 20 μs. Thereby, a theoretical value '0' will be written only into the charge storage unit 18 on the drain D side. In the electrical erasing process (2), the gate potential Vg is set to −6V, the source potential Vs is set to ground potential (0V), the drain potential Vd is set to 6V, the back gate potential Vb is set to ground potential (0V) (q.v., the row titled 'erasing (1)' in the table in FIG. 2B), and erasing time is set to 20 ms (milliseconds). Thereby, the theoretical value '0' stored in the charge storage unit 18 on the drain D side will be erased. Moreover, in the bake erasing process (3), baking temperature is set to 350° C. and baking time is be set to 2 hours.

As shown in FIG. 7, the higher the baking temperature $T_B$ becomes, the closer the threshold voltage variation $\Delta Vt$ gets to 0 V with shorter baking time $H_B$. That is, as the baking temperature $T_B$ becomes higher, the threshold voltage Vt of the memory cell 1 can be restored to the initial state in a shorter amount of time.

Here, it is preferable that the threshold voltage variation $\Delta Vt$ is 0 V. Thereby, it is possible to obtain the same sub-threshold characteristic as that in the initial state. However, it is appropriate as long as the threshold voltage variation $\Delta Vt$ is less than or equal to 0.2V. When the threshold voltage variation $\Delta Vt$ is less than or equal to 0.2V, it will become possible to decrease the influence of drain disturbance to a negligible extent.

Figure 8:
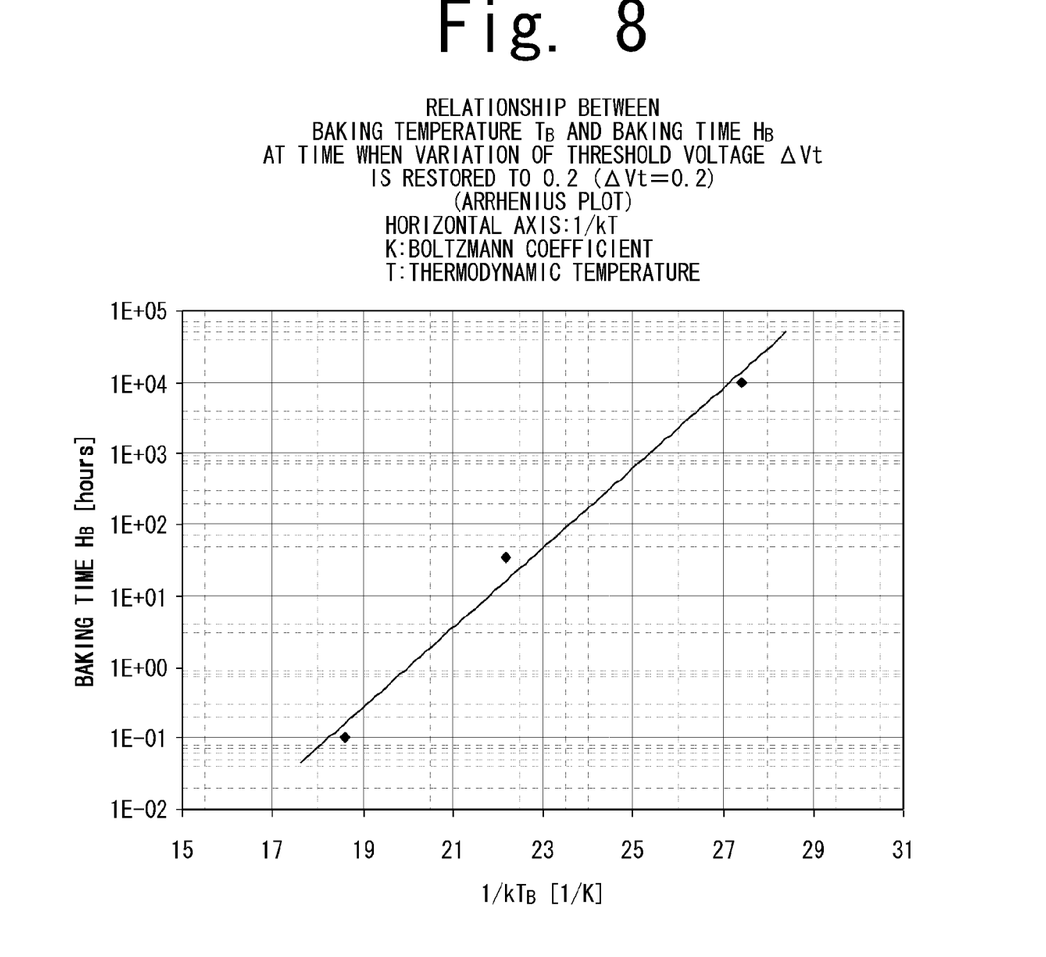
FIG. 8 is a graph showing the relationship (1) between the bake time $H_B$ and the bake temperature $T_B$ according to the embodiment of the present invention.
Figure 9:
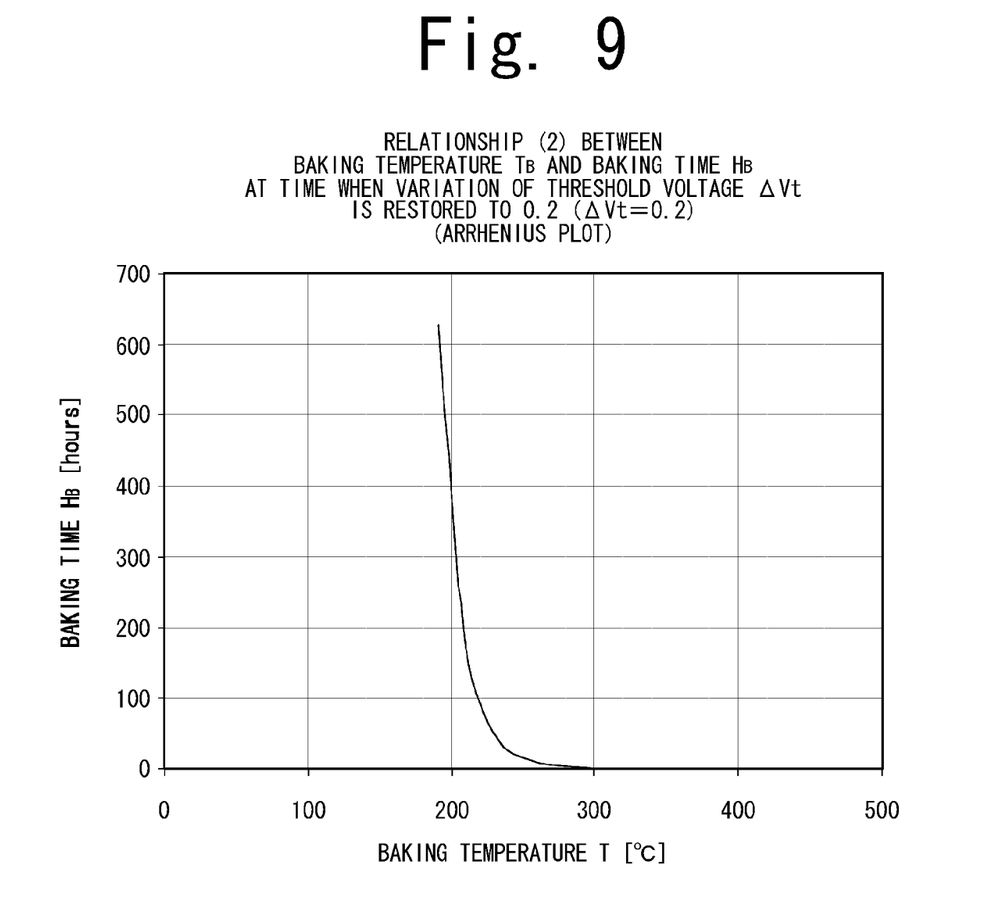
FIG. 9 is a graph showing the relationship (2) between the bake time $H_B$ and the bake temperature $T_B$ according to the embodiment of the present invention.

FIG. 8 shows the relationship (1) between the bake time $H_B$ and the bake temperature $T_B$ at the time when the threshold voltage variation $\Delta Vt$ is restored to 0.2 V. In addition, FIG. 9 shows the relationship (2) between the bake time $H_B$ and the bake temperature $T_B$ at the time when the threshold voltage variation $\Delta Vt$ is restored to 0.2 V. In FIGS. 8 and 9, the relationships (1) and (2) are shown in an Arrhenius plot, respectively. In addition, in FIG. 8, the vertical axis represents baking time $H_B$ and the horizontal axis represents $1/kT_B$ ('k' is a Boltzmann's coefficient or constant), and in FIG. 9, the vertical axis represents baking time $H_B$ and the horizontal axis represents baking temperature T (° C.).

Based on these Arrhenius plots shown in FIG. 8 and FIG. 9, the relationship between the bake time $H_B$ and the bake temperature $T_B$ at the time when the threshold voltage variation $\Delta Vt$ is restored to 0.2 V may approximate the following Formula 1. In Formula 1, y represents the baking time $H_B$, x represents the baking temperature $T_B$, and e is the base of the natural logarithm.

$$y = (6 \times 10^{-12}) e^{1.29/kx} \qquad \text{formula (1)}$$

k: Boltzmann coefficient
x: temperature
y: time

Accordingly, the conditions for the threshold voltage variation $\Delta Vt$ to become less than or equal to 0.2 V may be represented by the following Formula 2:

$$y \geq (6 \times 10^{-12}) e^{1.29/kx} \qquad \text{formula (2)}$$

k: Boltzmann coefficient
x: temperature
y: time

Method of Manufacturing Nonvolatile Semiconductor Memory Device

Figure 10:
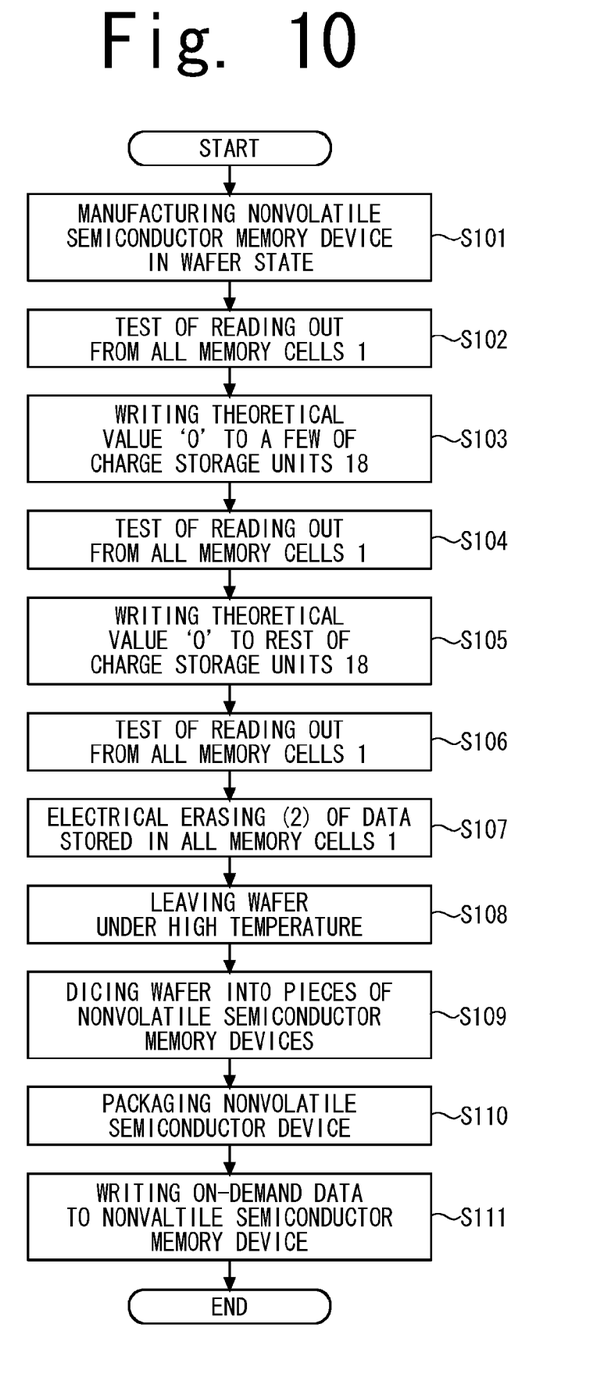
FIG. 10 is a flow chart showing a method of manufacturing the nonvolatile semiconductor memory device according to the embodiment of the present invention.

Now, a method of manufacturing a nonvolatile semiconductor memory device including the memory cells 1 according to the embodiment of the present invention will be described. FIG. 10 is a flow chart showing the manufacturing method according to the embodiment of the present invention.

In this manufacturing method, first, nonvolatile semiconductor memory devices in a wafer state will be manufactured (step S101). In other words, a wafer including multiple memory cells 1 will be prepared, each memory cell 1 including a gate electrode 15 formed on a semiconductor substrate 11, charge storage units 18 formed on both sides of the gate electrode 15, lightly doped regions 16 formed beneath the charge storage units 18, respectively, in the upper part of the semiconductor substrate 11, and highly doped regions 17 formed in a pair of regions sandwiching a region underneath the gate electrode 15 and the lightly doped regions 16 therebetween (first process). Here, nonvolatile semiconductor memory devices in a wafer state indicates a wafer having multiple semiconductor memory devices formed therein, the multiple semiconductor memory devices being aligned in two dimensions. Some steps in the method of manufacturing the nonvolatile semiconductor memory device of the present invention are known in the conventional art, and therefore, a detailed explanation thereof will be omitted here.

After the wafer including multiple memory cells 1 is prepared, a test will be conducted in which data is read out from all the memory cells 1 formed in the wafer (step S102). In this reading test, the above-described data reading method is to be used to sequentially read out data from the memory cells 1. At this point, since all the memory cells 1 are in the initial state, if the memory cells 1 are all normal, data '1' will be read out from the drain D side and the source S side of each memory cell 1. If there is any memory cell 1 from which data was not able to be read out, it will be determined that the nonvolatile semiconductor memory device including that memory cell 1 is defective.

Next, a theoretical value '0' will be written to at least one of the two charge storage units 18 in a portion of the memory cells 1 in the nonvolatile semiconductor memory device in the wafer state (step S103). For instance, the theoretical value '0' will be written to the charge storage unit 18 on the drain D side in a portion the memory cells 1. However, it is also possible to have the theoretical value '0' written to two of the charge storage units 18 in a portion of the memory cells 1 in the nonvolatile semiconductor memory device.

Next, a test will be conducted in which data is read out from all the memory cells 1 formed in the wafer (step S104). In this reading test, as with the reading test in step S102, the above-described data reading method is to be used to sequentially read out data from the memory cells 1. At this point, since the theoretical value '0' is being written to some of the charge storage units 18 of the memory cells 1, in step S103, if all the memory cells 1 are normal, the same data as that written in step S103 will be read out from the memory cells 1. Here, if it is not possible to read out the same data as that having been written from a certain memory cell 1, it will be determined that the nonvolatile semiconductor memory device including this memory cell 1 is defective, for instance.

Next, the theoretical value '0' will be written to the other charge storage units 18 of the memory cells 1 to which the theoretical value '0' was not written in step S103 (step S105). Thereby, the theoretical value '0' will be stored into both of the charge storage units 18 in each of all the memory cells 1.

Next, a test will be conducted in which data from all the memory cells 1 formed in the wafer is read out (step S106). In this reading test, as with the reading tests in steps S102 and S104, the above-described data reading method is to be used to sequentially read out data from the memory cells 1. At this point, since the theoretical value '0' is being written to all the charge storage units 18 of the memory cells 1, in step S105, if all the memory cells 1 are normal, the theoretical value '0' will be read out from all the memory cells 1. Here, if it is not possible to read out the theoretical value '0' from all the memory cells 1, it will be determined that the nonvolatile semiconductor memory device including this memory cell 1 is defective, for instance.

Next, data stored in all the memory cells 1 will be erased electrically (step S107). That is, in step S107, the theoretical value '0' stored in the charge storage units 18 in each of all the memory cells 1 will be erased by the electrical erasing process (2). In this step, the conditions shown in the row titled 'erasing (3)' shown in FIG. 2B will be used, for instance, in erasing the theoretical value stored in all the charge storage units 18. Thereby, the charge storage units 18 in all the memory cells 1 will hold the theoretical value '1'.

Next, the wafer with the memory cells 1 formed therein will be left under high temperature for a predetermined period of time (step S108). That is, in step S108, the data stored in the memory cells 1 will be erased by the bake erasing process (3). In this step, the bake erasing process (3) as described above will be used.

In this way, by going through step S107 and step S108, i.e., by going through electrical erasing (2) and bake erasing (3), it is possible to improve the disturb characteristic of the nonvolatile semiconductor memory device to approximately the level of the disturb characteristic in the initial state. Moreover, in this embodiment, since the electrical erasing process (2) (step S107) is conducted before the bake erasing process (3) (step S108), it is possible to easily lower the baking temperature or shorten the baking time as compared to when only the bake erasing process (3) is to be conducted. Therefore, compared to the case where only the bake erasing process (3) is to be conducted, this embodiment is capable of achieving improved manufacturing productivity.

Next, the nonvolatile semiconductor memory devices in the wafer state will be diced into individual pieces (step S109), and the diced nonvolatile semiconductor memory devices will be packaged (step S10). Referring to dicing and packaging methods, it is possible to use conventional methods, and therefore, a detailed explanation thereof will be omitted here.

Then, on-demand data complying with the requirements of the customer will be written into the packaged nonvolatile semiconductor memory device (step S111). Accordingly, the nonvolatile semiconductor memory device according to this embodiment will be shipped in a state of having data written thereto. In this regard, however, it is also possible to have the nonvolatile semiconductor memory device shipped in a state of not having data written thereto after step S110.

Taking the processes described above, a nonvolatile semiconductor memory device including multiple memory cells 1 having the structure according to this embodiment can be manufactured.

As described above, in the method of manufacturing a nonvolatile semiconductor memory device according to the embodiment of the present invention, first, a wafer including multiple memory cells 1 will be prepared, each memory cell 1 including a gate electrode 15 formed on a semiconductor substrate 11, charge storage units 18 formed on both sides of the gate electrode 15, lightly doped regions 16 formed beneath the charge storage units 18, respectively, in the upper part of the semiconductor substrate 11, and highly doped regions 17 formed in a pair of regions sandwiching a region underneath the gate electrode 15 and the lightly doped regions 16 therebetween, and then, data stored in the charge storage units 18 of all the memory cells 1 formed in the wafer will be erased electrically (electrical erasing (2)), and then, the wafer will be left under high temperature for a predetermined period of time (bake erasing (3)). Thus, the method of manufacturing a nonvolatile semiconductor memory device according to the embodiment of the present invention includes a data erasing method (2, 3) in which data stored in the charge storage units 18 of all the memory cells 1 formed in the wafer will be erased electrically (electrical erasing (2)), after which the wafer will be left under high temperature for a predetermined period of time (bake erasing (3)).

Therefore, according to the embodiment of the present invention, it is possible to improve the disturb characteristic of the nonvolatile semiconductor memory device to approximately the level of the disturb characteristic in the initial state. Moreover, in this embodiment, since the electrical erasing process (2) is conducted before the bake erasing process (3), it is possible to easily lower the baking temperature or shorten the baking time as compared to the case where only the bake erasing process (3) is to be conducted. Therefore, as compared to the case where only the bake erasing process (3) is to be conducted, this embodiment is capable of achieving higher manufacturing productivity.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-368994. The entire disclosures of Japanese Patent Application No. 2005-368994 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a nonvolatile semiconductor memory device comprising:
    preparing a wafer including multiple memory cells, each memory cell having a gate electrode formed on a semiconductor substrate, charge storage units formed on both sides of the gate electrode, lightly doped regions formed respectively beneath the charge storage units in an upper part of the semiconductor substrate, and highly doped regions formed in regions sandwiching a region underneath the gate electrode and the lightly doped regions therebetween; and
    erasing data stored in the charge storage units,
    said erasing including a first stage of electrically erasing the data stored in the charge storage units, and a second stage of high temperature bake erasing to further erase the data stored in the charge storage units,
    wherein the second stage comprises bake erasing at a temperature of about 350° C. for about 2 hours.

2. The method of manufacturing a nonvolatile semiconductor memory device according to claim 1, wherein the second stage Comprises thermally treating the wafer under conditions as follows:

$$y > (6 \times 10^{-12}) e^{1.29/kx},$$

wherein k is Boltzmann's constant, x is the temperature in K, and y is the period of time in hours.

3. The method of manufacturing a nonvolatile semiconductor memory device according to claim 1, wherein the first stage comprises applying a bias potential between the gate electrodes and one of the highly doped regions of each of the charge storage units.

4. The method of manufacturing a nonvolatile semiconductor memory device according to claim 1, further comprising:
    conducting a first test in which the data is read out from all the memory cells of the wafer;
    conducting a second test in which the data is read out from all the memory cells of the wafer after writing a first theoretical value into at least one of the charge storage units in a portion of the memory cells of the wafer; and
    conducting a third test in which the data is read out from all the memory cells of the wafer after writing the first theoretical value into remaining ones of the charge storage units in which the first theoretical value was not written during the second test,
    wherein said erasing is performed after the first theoretical value is written into all of the charge storage units.

5. The method of manufacturing a nonvolatile semiconductor memory device according to claim 1, wherein each charge storage unit comprises a charge storage film and a pair of potential barrier films which sandwich the charge storage film therebetween.

6. The method of manufacturing a nonvolatile semiconductor memory device according to claim 5, wherein the charge storage film comprises a nitride film, and the potential barrier films comprise oxide films.

* * * * *